(12) United States Patent
Klein (10) Patent No.: US 9,414,494 B2
(45) Date of Patent: Aug. 9, 2016

(54) CURRENT SENSOR

(75) Inventor: Philippe Klein, Saint Pierre d'Allevard (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 200 days.

(21) Appl. No.: 13/603,698

(22) Filed: Sep. 5, 2012

(65) Prior Publication Data

US 2013/0057267 A1  Mar. 7, 2013

(30) Foreign Application Priority Data

Sep. 7, 2011  (FR) ...................... 11 57935

(51) Int. Cl.
*G01R 19/00* (2006.01)
*H05K 1/16* (2006.01)
*G01R 15/18* (2006.01)
*H05K 1/02* (2006.01)
*H05K 3/46* (2006.01)

(52) U.S. Cl.
CPC .............. *H05K 1/165* (2013.01); *G01R 15/185* (2013.01); *H05K 1/0239* (2013.01); *H05K 3/46* (2013.01); *H05K 2201/086* (2013.01); *H05K 2201/097* (2013.01); *H05K 2201/09263* (2013.01); *H05K 2201/09672* (2013.01)

(58) Field of Classification Search
CPC ...... G01R 15/185; G01R 33/04; G01R 33/05; G01R 33/07; G01R 21/06; H05K 1/165; H05K 1/0239; H05K 2201/097; H05K 2201/086; H01L 23/5227; G01N 27/904; G01N 27/902; G01N 27/90

USPC ........ 324/234, 228, 232, 244, 260; 360/84 C, 360/170, 200, 221, 222, 223, 232
See application file for complete search history.

(56) References Cited

U.S. PATENT DOCUMENTS

| | | | | |
|---|---|---|---|---|
| 3,596,260 | A | * | 7/1971 | Olson et al. ...................... 365/58 |
| 5,389,876 | A | * | 2/1995 | Hedengren .......... G01N 27/904 324/242 |
| 7,262,680 | B2 | * | 8/2007 | Wang ............................ 336/200 |
| 7,372,261 | B2 | | 5/2008 | Choi et al. |
| 8,604,782 | B2 | * | 12/2013 | Yamamoto .................... 324/240 |
| 2006/0001422 | A1 | * | 1/2006 | kang et al. ..................... 324/260 |
| 2007/0024269 | A1 | * | 2/2007 | Tadatsu .................. G01R 21/06 324/127 |
| 2008/0048643 | A1 | * | 2/2008 | Delevoye et al. ......... 324/117 R |
| 2008/0048814 | A1 | * | 2/2008 | Weger ..................... H01F 27/38 336/182 |

(Continued)

FOREIGN PATENT DOCUMENTS

DE  10310503  9/2004

*Primary Examiner* — Tung X Nguyen
*Assistant Examiner* — David Frederiksen
(74) *Attorney, Agent, or Firm* — Occhiuti & Rohlicek LLP (57) ABSTRACT

A current sensor includes a printed circuit and current lines. The printed circuit comprises a stack, along a vertical direction, of metallization layers mechanically separated by electrically insulating layers, and a measurement or excitation coil wound around a vertical winding axis. The coil is formed by conductive tracks made in at least one metallization layer. One or more current lines are positioned in a plane parallel to the layers and are configured to be supplied with currents to be measured. The coil comprises turns formed by conductive tracks, made in respective metallization layers, electrically connected to one another by pads passing through at least one of the electrically insulating layers, to form a coil that extends along the vertical winding axis.

9 Claims, 5 Drawing Sheets

(56) References Cited

U.S. PATENT DOCUMENTS

| | | | |
|---|---|---|---|
| 2008/0252289 A1* | 10/2008 | Lenglet | 324/253 |
| 2008/0316655 A1 | 12/2008 | Shoji | |
| 2010/0007358 A1* | 1/2010 | Schaerrer | G01F 15/14 324/649 |
| 2010/0289610 A1* | 11/2010 | Jacobson et al. | 336/84 C |
| 2011/0241665 A1* | 10/2011 | Takatsuji | G01R 33/0023 324/253 |
| 2011/0310579 A1* | 12/2011 | Smeys | H01F 17/0013 361/782 |
| 2013/0099334 A1* | 4/2013 | Mohan | G01R 33/04 257/421 |

\* cited by examiner

CURRENT SENSOR

RELATED APPLICATIONS

Under 35 USC 119, this application claims the benefit of the priority date of French Patent Application 1157935, filed Sep. 7, 2011, the contents of which are herein incorporated by reference.

FIELD OF INVENTION

The invention pertains to a current sensor as well as to a printed circuit board for making this current sensor.

BACKGROUND

A printed circuit board or PCB is a carrier used for the electrical connection of a set of electrical components. Such a printed circuit board generally takes the form of a stratified or laminated plate. This printed circuit board may be a single-layer or multilayer printed circuit board. A single-layer printed circuit board has only one metallization layer in which there are printed conductive tracks that electrically connect the different electrical components to one another. A multilayer printed circuit board on the contrary has several metallization layers, i.e. at least two layers and, preferably, more than four or six layers. The description here below shall be concerned chiefly with these multilayer printed circuit boards.

A metallization layer is one of the layers of the stratified plate forming the printed circuit board in which one or more conductive tracks are made, electrically connecting the different electrical components to one another. This layer is flat and extends in parallel to the plane of the stratified plate. Generally, the metallization layer is obtained by depositing a uniform layer of a conductive material, typically a metal such as copper, and then etching this uniform layer to allow only the conductive tracks to remain.

The different metallization layers of the printed circuit board are mechanically spaced out from one another by insulating layers made of an electrically insulating material. This insulating material has high dielectric rigidity, i.e. typically greater than 3 MV/m and preferably greater than 10 MV/m. For example, the electrically insulating material is made of epoxy resin and/or fiberglass. The insulating layer generally takes the form of a rigid plate made of a material that does not become viscous when it is joined with other layers. For example, it is made of a thermosetting resin which has already undergone irreversible thermosetting.

The different layers of the multilayer printed circuit board are joined to one another without any degree of freedom by means of adhesive layers known as "pre-impregnated" layers and more generally known as "prepreg" layers.

A pre-impregnated layer is constituted by an thermosetting resin impregnating, generally a reinforcing element such as a fabric. Typically, the resin is an epoxy resin. During the manufacturing of the printed circuit board, the transformation of the thermosetting resin brings into play an irreversible polymerization which converts the pre-impregnated material into a solid and rigid material that irreversibly bonds together the different layers of the printed circuit board. Typically, each transformation takes place when the pre-impregnated layer is heated to a high temperature and is compressed with high pressure. Here, a high temperature is a temperature above 100° C. and preferably above 150° C. A high pressure is a pressure greater than 0.3 MPa and typically greater than 1 MPa.

The conductive tracks of the different metallization layers can be electrically connected by means of conductive pads passing through the insulating layers. The conductive pads are more generally known as "vias". The vias generally extend perpendicularly to the plane of the layers. There are different ways of making these vias. One of the most common ways is to make a hole in the insulating layer or layers to be crossed and then to coat the inner wall of these holes with a metal. They are then referred to as metallized holes.

A via does not necessarily go through all the layers of the printed circuit board. Thus, there are blind holes which open onto only one external face of the printed circuit board. At present, it is also possible to make "buried" vias for example by means of known technologies such as HDI (High Density of Integration) technologies. A buried via does not open into any of the external faces of the printed circuit board. For example, a buried via electrically connects conductive tracks made in metallization layers buried within the printed circuit board.

Prior-art current sensors comprise: a printed circuit comprising: a stack, along a vertical direction, of several metallization layers mechanically separated from one another by electrically insulating layers, and at least one measurement or excitation coil wound around a vertical winding axis, each coil being formed by conductive tracks made in at least one of the metallization layers, and one or more current lines positioned in parallel to the plane of the metallization layers, this current line or these current lines being intended for being supplied by one or more of the currents to be measured.

For example, a current of this kind is known from the following document: T. O'Donnell, A. Tipek, A. Connell, P. McCloseky, S. C. O'Mathuna, "*Planar fluxgate current sensor integrated in printed circuit board*", Sensors and Actuators A 129 (2006) 20-24.

In prior-art sensors, the measurement and excitation coils are each made on a single metallization layer. Because of this, the coils are called "planar" coils. To form the turns of these coils, each coil describes a spiral in a metallization layer.

The prior art is also known from: US2008/316655A1, and DE10310503A1.

The prior-art sensors work accurately. However, it is desirable to improve their precision or compactness or to reduce their energy consumption as well as their response time.

SUMMARY OF THE INVENTION

An object of the invention therefore is a current sensor in which the turns of each coil are formed by conductive tracks, made in respective metallization layers, electrically connected to one another by pads passing through at least one of the insulating layers, to form the coil that extends along the vertical axis.

The above current sensor uses "vertical" coils, i.e. coils that extend and wind along a vertical winding axis. For a same number of turns, a vertical coil picks up or generates a magnetic field that is more homogenous than that of a planar coil. Consequently, the above sensor is more precise.

The embodiments of this sensor may comprise one or more of the following characteristics:
- the printed circuit comprises a hole made along each vertical winding axis and the sensor has a magnetic core housed within this hole, this magnetic core having transverse dimensions, i.e. dimensions parallel to the plane of the layers, that are smaller, by at least 5 μm, than the corresponding transverse dimensions of the hole to create a clearance between vertical walls of the hole and vertical faces facing the magnetic core;

said at least one coil has a first pair of measuring coils formed by a first and second measurement coils positioned on either side of the current line and laid out so that the sum or the difference of the magnetic fields measured by each of these coils preserves the contribution of the magnetic field $B_i$ generated by the current line or lines and reduces the contribution of any homogenous magnetic field throughout the surface of the printed circuit;

a through-hole is made at the center of each coil and the sensor has a same magnetic ring passing through the holes at the center of the measurement coils of the first pair;

said at least one coil has a first and a second pair of coils positioned one after the other along the current line or lines, each pair of coils comprising a first and a second measurement coil positioned on either side of the current line or lines, a through hole being made at the center of each coil, and the sensor comprises a first and a second magnetic ring, the first magnetic ring passing through the holes at the center of the measurement coils of the first pair and the second magnetic ring passing through the holes at the center of the measurement coils of the second pair;

said at least one coil comprises a first and a second pair of coils positioned one after the other along the current line or lines, each pair of coils comprising a first and a second measurement coils positioned on either side of the current line or lines, a through-hole being made at the center of each coil, and the sensor comprises first and second magnetic rings, the first magnetic ring passing through the holes at the center of the first coils of each pair, and the second ring passing through the holes at the center of the second coils of each pair so that each magnetic ring is situated on a respective side of a vertical plane passing through the current line or lines.

These embodiments furthermore have the following advantages:

housing the magnetic core in a hole eliminates or greatly limits the mechanical stresses likely to be exerted on this core by the vertical walls of the hole especially in response to a temperature variation, thus increasing the precision of the sensor;

positioning first and second measurement coils on either side of the current line compensates for an external magnetic field homogenous throughout the surface of the printed circuit such as the earth's magnetic field;

using a magnetic ring passing through the center of the measurement coils and surrounding the conductive line increases the sensitivity of the sensor;

using two magnetic rings each situated on a respective side of the current line makes it possible, when designing the printed circuit, to adjust the voltage generated by each measurement coil in adjusting the distance between this measurement coil and the current line.

An object of the invention is also a printed circuit for the above current sensor comprising:

a stack, along a vertical direction, of several metallization layers mechanically separated from one another by electrically insulating layers, at least one measurement or excitation coil wound around a vertical winding axis, the turns of each coil being formed by conductive tracks made in respective metallization layers, electrically connected to one another by pads passing through at least one of the insulating layers to form the coil that extends along the vertical axis, and one or more current lines to be powered by one or more currents to be measured, each current line being formed by conductive tracks made in at least one metallization layer of the stack.

The embodiments of this printed circuit may comprise one or more of the following characteristics:

said at least one coil comprises:
a first pair of coils formed by a first and a second coil positioned on either side of the current line, the first coil being the symmetric of the second coil relatively to a first vertical plane, and
a second pair of coils symmetrical with the first pair of coils relatively to a second vertical plane perpendicular to the first vertical plane;

said at least one coil comprises a measurement coil and an excitation coil that are concentric, i.e. the turns of each of these coils are made in the same metallization layer and are wound around the same winding axis;

said at least one coil comprises a first and a second measurement coil and each current line comprises:
at least one first and one second conductive track passing between the first and second measurement coils, these first and second tracks being made in respective metallization layers positioned one above the other, and
an electrical connection setting up a series connection of these two conductive tracks without passing between the measurement coils, this connection forming, with the two conductive tracks, a loop completely surrounding at least one of the measurement coils so that, when it is powered, the current passes several times in the same sense between the measurement coils.

The embodiments of this printed circuit furthermore have the following advantages:

the two axial symmetries between the coils enable an increase in the homogeneity of the magnetic field measured or generated by these coils, thus contributing to improving the precision of a sensor incorporating these coils, the fact that the measurement coil and the excitation coil are concentric limits the energy consumption of the sensor and diminishes the response time of this sensor, making the current lines so that the current passes several times in the same sense between the measurement coils increases the sensitivity of the sensor made with this printed circuit.

DESCRIPTION OF THE DRAWINGS

The invention will be understood more clearly from the following description, given purely by way of a non-exhaustive example and made with reference to the appended drawings, of which.

In these figures, the same references are used to designate the same elements.

Here below in this description, the characteristics and functions well known to those skilled in the art are not described in detail.

DETAILED DESCRIPTION OF THE INVENTION

Figure 1:
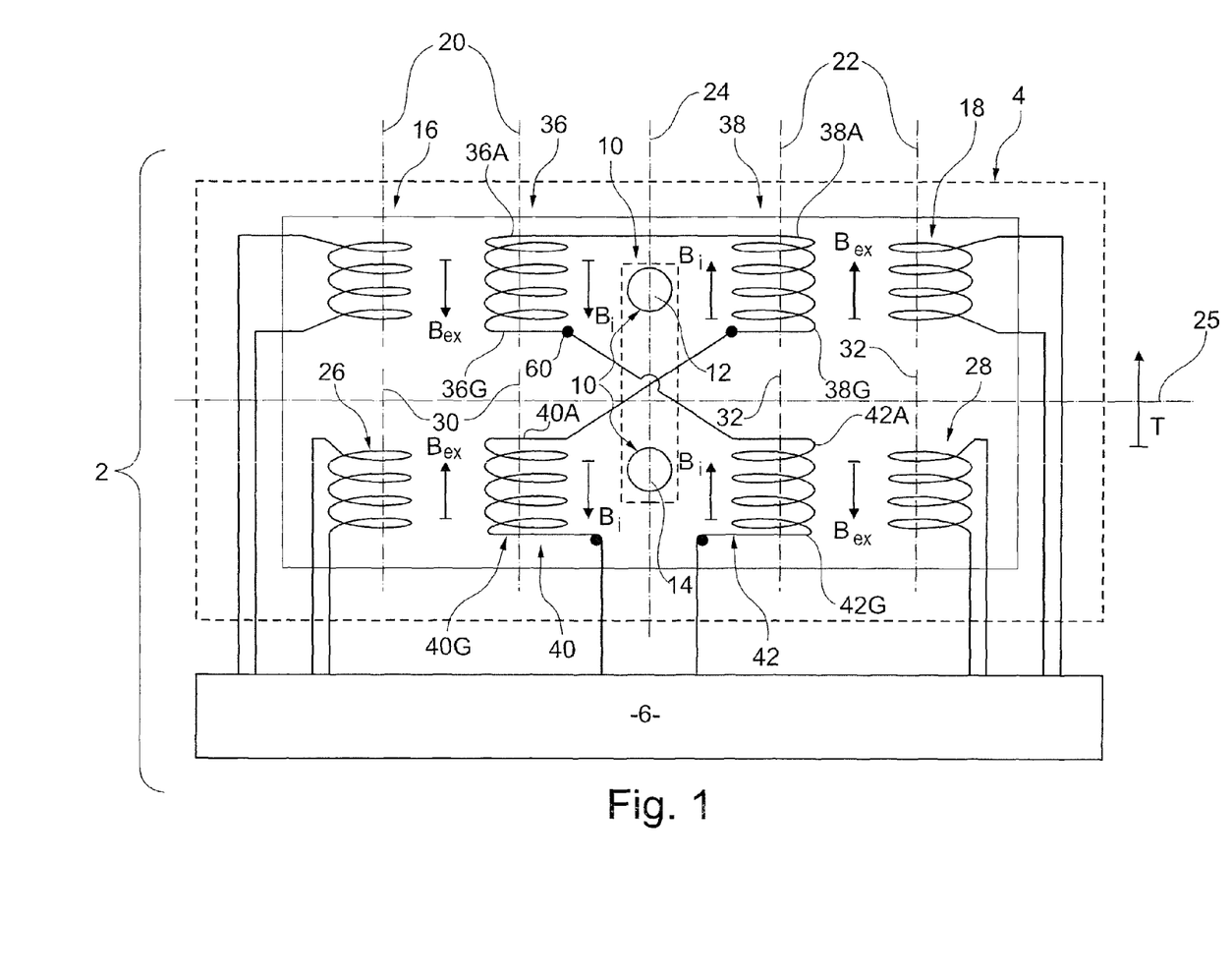
FIG. 1 is a schematic illustration of the architecture of a current sensor.

FIG. 1 illustrates a current sensor 2. This illustration has been given purely to explain the working of the sensor. More detailed examples of embodiments of this sensor are described further below.

The sensor 2 has a printed circuit 4 and an electronic processing unit 6.

The printed circuit 4 is a multilayer printed circuit, the metallization layers of which are horizontal.

In this embodiment, the printed circuit 4 has a line 10 in which the current to be measured flows. In FIG. 1, only two cross-sections 12, 14 of this line 10 are represented. These cross-sections are two successive cross-sections of the line 10.

The line 10 generates a magnetic field $B_i$, the field lines of which form circles around the current line. Thus, the magnetic fields $B_i$ at the two points situated on either side of the line 10 and at the same distance from this line 10 are equal in amplitude but have opposite directions. The amplitude of the magnetic field $B_i$ depends on the intensity of the current i that flows in the line 10.

The printed circuit 4 also has two pairs of coils. The first pair is formed by two measurement coils 16, 18. The coils 16, 18 are wound respectively around vertical axes 20 and 22 perpendicular to the plane of the metallization layers of the printed circuit 4. These coils 16 and 18 are identical except that they are positioned on either side of the line 10. Preferably, the coils 16 and 18 are symmetrical with each other relatively to a vertical plane 24 passing through the line 10. The turns of the coils 16 and 18 are wound around a saturable magnetic core. This magnetic core has not been shown in FIG. 1. Typically, the magnetic core is a magnetic core made out of a ferromagnetic material, for which the static relative permeability, i.e. the permeability at zero frequency, is very high. The expression "very high static relative permeability" refers to the fact that the static relative permeability is greater than 1000 and preferably greater than 10000 or 100000. For example, the magnetic core is made out of a material such as mu-material or a known magnetic material commercially known as Vitrovac® 6025.

Typically, each coil 16, 18 comprises more than two turns and preferably more than three or six turns stacked on one another in the vertical direction.

The magnetic field measured by the coils 16 and 18 are respectively denoted $M_1$ and $M_2$ here below in this description.

The second pair of measurement coils is symmetrical with the first pair relatively to a vertical plane 25 perpendicular to the plane 24. The second plane is situated downstream or upstream with respect to the first pair along the line 10. Here, the measurement coils of this second pair respectively carry the references 26 and 28. The vertical axes around which the coils 26 and 28 are wound respectively carry the references 30 and 32.

The printed circuit 4 also has four excitation coils 36, 38, 40 and 42. These coils 36, 38, 40 and 42 are each formed out of several turns respectively wound around the axes 20, 22, 30 and 32. Typically, the number of turns of each excitation coil, stacked one on top of the other in the vertical direction, is greater than or equal to two, and preferably greater than or equal to three or six. Here, each excitation coil is concentric with a respective measurement coil. The term "concentric" designates the fact that the turns of each of these coils is made in the same metallization layer and are wound around a same winding axis. Preferably, all the turns of a concentric coil are made in the same metallization layers as the turns of the other coil which is concentric to it. Here, the measurement coils are wound around excitation coils. To clarify FIG. 1, the coils 36 to 42 are represented beside the measurement coils with which they are associated.

The excitation coils are symmetrical with one another relatively to the planes 24 and 25 as in the case of the measurement coils. They are series-connected electrically in this embodiment. Thus, each excitation coil generates a magnetic field $B_{ex}$ of the same amplitude in the magnetic core of the measurement coil with which it is associated. More specifically, the coils 38 and 40 are electrically connected so that both generate a field $B_{ex}$ of a same direction while the excitation coils 36 and 42 are connected so as to generate a magnetic field $B_{ex}$ in opposite directions. In this description, the term "connected" designates the fact of making an electrical connection.

Each excitation coil has upper and lower end turns. These upper and lower end turns carry the same numerical references as the excitation coil except that they are followed respectively by the symbols "A" and "G". In this embodiment, the excitation coils are series-connected as follows:

the lower turn 40G is directly connected to an excitation current source, the upper turn 40A is directly connected to the lower turn 38G, the upper turn 38A is directly connected to the upper turn 36A, the lower turn 36G is directly connected to the upper turn 42A, and the lower turn 42G is directly connected to the current source.

In the above paragraph, the term "directly" designates the fact that the turns are connected to one another without passing through another of the coils 36 to 42.

Thus, the magnetic fields $M_1$, $M_2$, $M_3$ and $M_4$ respectively measured by the coils 16, 18, 26 and 28 are given by the following relationships:

$$M_1 = T - B_i - B_{ex},$$

$$M_2 = T + B_i + B_{ex},$$

$$M_3 = T - B_i + B_{ex},$$

$$M_4 = T + B_i - B_{ex},$$

where T is a magnetic field homogenous throughout the surface of the printed circuit 4.

The term "homogenous magnetic field" designates the fact that this field T has the same direction and the same amplitude at every point of the printed circuit 4. Typically, this magnetic field T is the earth's magnetic field.

The processing unit 6 acquires the measurements $M_1$, $M_2$, $M_3$ and $M_4$ obtained by means of the coils 16, 18, 26 and 28 and therefrom deduces the intensity of the current i flowing in the line 10. To this end, the unit 6 makes compensations in the measurements $M_1$, $M_2$, $M_3$ and $M_4$ to eliminate the contributions of the magnetic field $B_{ex}$ and T and to keep only the contribution of the magnetic field $B_i$. For example, to this end, the unit 6 combines the measured magnetic fields $M_1$, $M_2$, $M_3$ and $M_4$ by means of simple arithmetical operations. In the embodiment described, the compensated magnetic field is obtained by means of the following relationship: $M_2+M_4-M_1-M_3=4B_i$. Preferably, the measurement coils 16, 18, 26 and 28 are electrically connected to one another so as to obtain the previous sum. Thus, only the result of this sum is transmitted to the unit 6.

Thus, the unit 6 is capable of automatically compensating for the contributions of the magnetic fields $B_{ex}$ and T.

In this particular case, the unit 6 also generates the excitation current.

Typically, the unit 6 is made using an integrated electronic circuit.

Figure 2:
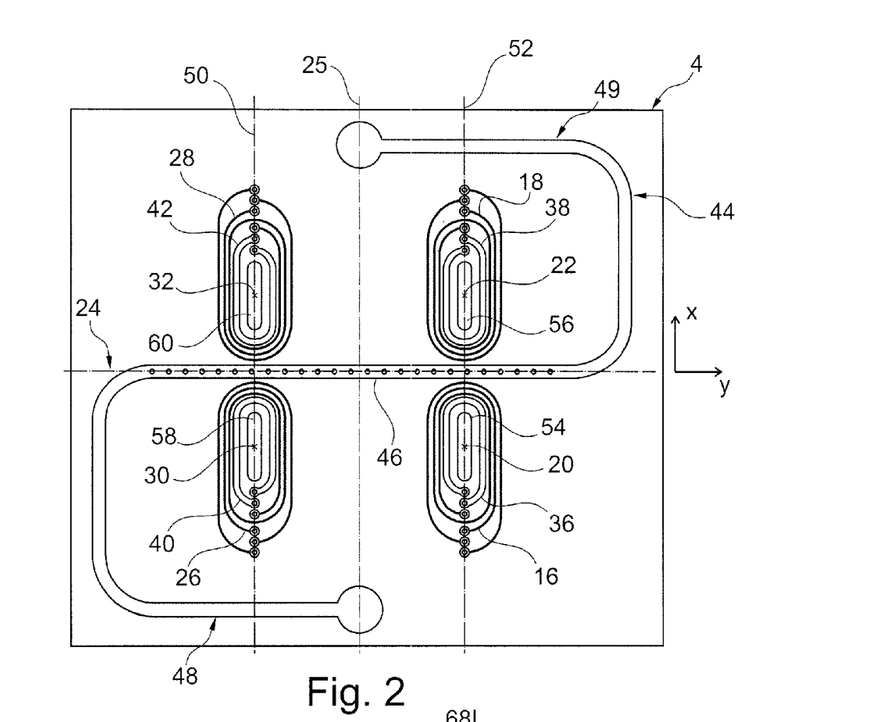
FIG. 2 is a schematic illustration of a top view of a metallization layer of a printed circuit used to make the sensor of FIG. 1.

FIG. 2 represents a metallization layer of the printed circuit 4. The printed circuit 4 is made by a stacking, in a vertical direction Z, of seven metallization layers each extending in a horizontal plane parallel to orthogonal directions X and Y. The metallization layer represented is an intermediate metallization layer, i.e. a layer included between upper and lower metallization layers respectively forming the upper and lower faces of the circuit 4. Here below in this description, the upper and lower faces are not represented in the figures.

The line 10 is formed by several conductive tracks made in different metallization layers series-connected by vertical vias. In FIG. 2, only the track 44 can be seen. Each conductive track comprises:
 a rectilinear segment 46 which passes between the two measurement coils of a same pair, and
 two loop portions 48, 49 to series-connect the different segments of the line 10.

Here, the segment 46 passes through the vertical planes 50 and 52. The plane 50 is the plane that contains the axes 30 and 32 while the plane 52 is the plane that contains the vertical axes 20 and 22. The segment 46 is perpendicular to the planes 50 and 52.

The sense in which the planes 50 and 52 are crossed by the line 10 corresponds to the direction of the current which crosses it when the line 10 is powered by a direct current.

The loop portions 48 and 49 are laid out so that the current which flows in each segment of the line 10 always crosses the planes 50 and 52 in the same sense. They enable the current flowing in the upper segment of the line 10 to be brought towards a segment situated beneath it. These loop portions 48 to 49 do not pass between the axes 20 and 22 or between the axes 30 and 32. To this end, they circumvent the measurement coils externally. Externally is herein defined as being the region of the printed circuit 4 which is located opposite the side on which the measurement coils closest to the plane 24 are placed.

The line 10 is described in greater detail with reference to FIG. 6.

As represented in this figure, the two pairs of measurement coils are positioned one after the other in the direction Y along which the segments 46 extend.

Figure 5:
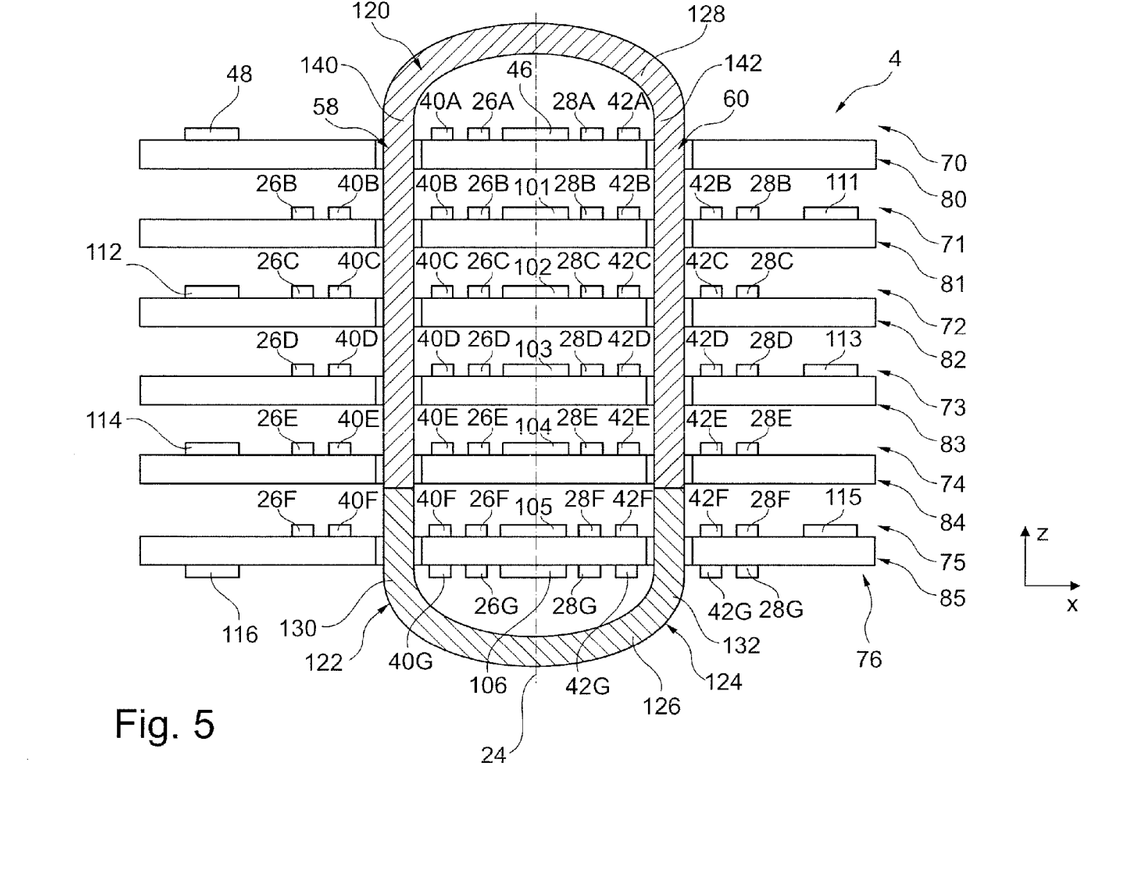
FIG. 5 is a schematic illustration of the printed circuit of the sensor of FIG. 1 in which the different layers of the printed circuit have been separated in order to show them.

The circuit 4 also has four holes 54, 56, 58 and 60 vertically crossing the circuit 4 from one side to the other. These holes are designed to receive magnetic cores. An example of such a magnetic core is shown in FIG. 5. These holes are hollow along vertical axes 20, 22, 30 and 32 respectively. These holes are oblong holes. The greatest widths of the holes 54 and 56 are included in the plane 52 and the greatest widths of the holes 58, 60 are included in the plane 50.

Figure 3:
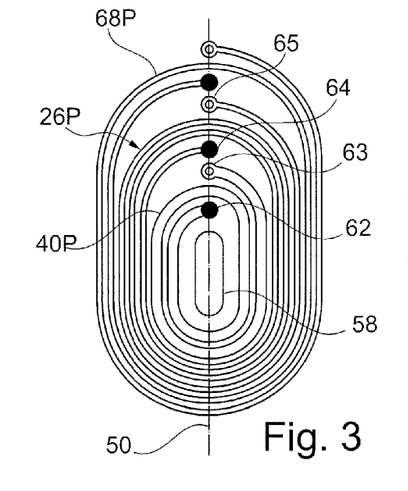
FIGS. 3 and 4 are schematic illustrations of conductive tracks of coils of the sensor of FIG. 1 made respectively in even-order and odd-order metallization layers.
Figure 4:
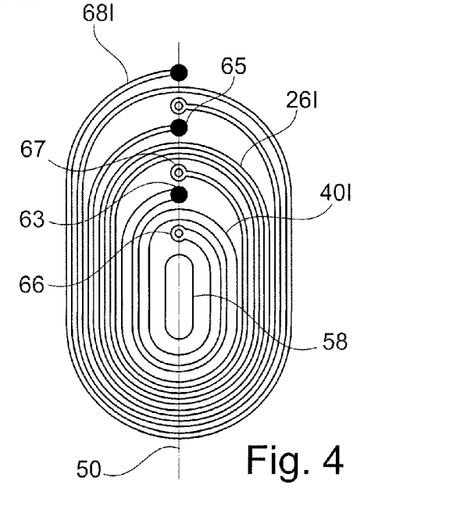

FIGS. 3 and 4 give a more detailed view of the conductive tracks of the coils 26 and 40 respectively made in the even-order and odd-order intermediate metallization layers. These coils are herein formed by the stacking, alternately, of the even-order and odd-order metallization layers one on top of the other in the direction Z. In these figures, the conductive tracks carry the same reference as the coil but are followed by a "P" for the even-order metallization and an "I" for the odd-order metallization layer. In these figures, the ends of the conductive tracks end either in a dot or in a circle. The dot and the circle represent the lower and upper ends respectively of a via.

The track 40P is wound starting from a via 62 around the hole 58 up to a via 63 in going from the interior to the exterior in the counter-clockwise sense.

Similarly, the track 26P gets wound around the track 40P starting from a via 64 up to a via 65 in passing from the interior to the exterior in the counter-clockwise sense.

In the odd-order metallization layer, just beneath, the track 40I winds from the via 63 up to a via 66 around the hole 58 in going from the exterior to the interior in the counter-clockwise sense.

The track 26I gets wound starting from the via 65 up to a via 67 around the track 40I in starting from the exterior to the interior in the counter-clockwise sense.

In each even-order and odd-order metallization layer, the tracks of the coils 26 and 40 make several turns around the hole 58.

In FIGS. 3 and 4, track 68P and 68I of a compensation coil have also been shown. These tracks get wound around tracks of the measurement coil. The compensation coil enables the generation of a magnetic field which cancels out the magnetic field in the magnetic core introduced in the hole 58. Thus, the intensity of the current flowing in the line 10 is deduced from the intensity of the current supplying the coil 68. This makes it possible especially to work in a zero field in the magnetic core.

In this embodiment, the tracks 26I, 40I and 60I are deduced from the tracks 26P, 40P and 68P by an axial symmetry relatively to the plane 50. Thus, the superimposition in a same horizontal plane of the conductive tracks of the even-order and odd-order metallization layers forms a pattern having an axial symmetry along an axis contained in the plane 50.

The vias 62 to 67 are all contained in the plane 50.

Here below in this description, the compensation coil is similar to the measurement coil and shall not be described in greater detail.

The tracks of the other coils 16, 18, 28, 36, 38, 42 are deduced from the tracks of the coils 26 and 40 by symmetry relatively to the planes 24 and 25.

FIG. 5 represents a more detailed view of the stacking of the different layers of the printed circuit 4 in which the layers have been separated to show them. Here, the printed circuit 4 comprises seven intermediate metallization layers 70 to 76 mechanically separated by insulating layers 80 to 85 respectively.

The conductive tracks are made in each of the metallization layers 70 to 76 to form the line 10, the measuring coils 26 and 28 and the excitation coils 40 and 42. In FIG. 5, the printed circuit is shown in a section along the plane 50.

In FIG. 5, the turns of a coil carry the reference of this coil followed by the letters A, B, C, D, E, F and G starting from the upper-end turn up to the lower-end turn. Thus, the turns whose references end with. A, B, C, D, E, F and G are made respectively in metallization layers 70, 71, 72, 73, 74, 75 and 76. The tracks of each coil are series-connected by means of vertical vias not shown in this figure. To simplify this figure, the conductive tracks of a same coil are represented by simple rectangles even if the track makes several turns around the holes 58 and 60.

The line 10 also has seven conductive tracks made in the metallization layers 70 to 76. In the metallization layers 70 to 76, the line 10 comprises:
- a rectilinear segment respectively bearing the references 46 and 101 to 106 passing between each pair of measurement coils perpendicularly to the planes 25, 50 and 52, and
- a loop portion respectively carrying the references 48, 111 to 116.

The segments 46, 101 to 106 and the loop portions 48, 110 to 116 are made respectively in the layers 70 to 76. The segments 46, 101 to 106 are stacked on top of one another in the direction Z. They are also symmetrical relatively to the plane 24.

In this embodiment, when the conductive tracks of the line 10, made in two immediately consecutive metallization layers in the vertical direction, are superimposed in a same horizontal plane, these tracks are the symmetrics of each other relatively to the plane 24. Thus, the loop portions 48, 112, 114 and 116 surround the coils 16 and 26 by the exterior while the loop portions 111, 113 and 115 surround the coils 18 and 28 by the exterior.

The structure of the line 10 thus obtained is described in greater detail with reference to FIG. 6.

FIG. 5 also shows the magnetic core 120 housed in the holes 58 and 60. This magnetic core is designed to channel the magnetic fields $B_i$ and $B_{ex}$. Here, it has the shape of a ring comprising two vertical arms 122 and 124 crossing the printed circuit from one side to the other by means of the holes 58 and 60 respectively. The lower ends of the legs 122 and 124, which project beyond the lower face of the printed circuit, are made mechanically and magnetically connected to each other by a horizontal member 126 which passes above the conductive tracks 40G, 26G, 106, 28G and 42G. The upper ends of the horizontal members 122 and 124 are mechanically and magnetically connected to each other by a horizontal member 128 which passes above the conductive tracks 40A, 26A, 46, 28A and 42A. Thus, the magnetic core 120 completely surrounds the segments 46, 101 to 106 of the line 10.

The core 120 is made of a lower U-shaped part and an upper U-shaped part made of magnetic material. Each part has a bottom respectively forming the horizontal members 126 and 128. The lower part has two vertical arms 130 and 132 and the upper part has two vertical arms 140 and 142. The vertical arms 130 and 132 are inserted in the holes respectively 58 and 60 from the lower face of the printed circuit. Conversely, the arms 140, 142 are inserted respectively into the holes 58 and 60 from the upper face of the printed circuit. In the thickness of the printed circuit, the arms 130 and 140 are superimposed in the direction Y to establish the continuity of the magnetic circuit between the two U-shaped parts. Here, the arms 130 and 140 overlap on more than a third of their height. The is also the case for the arms 132 and 142.

The greatest transverse dimensions of the magnetic core 120 within the holes 58 and 60 are strictly smaller by at least 5 μm and preferably smaller by at least 100 μm than the corresponding transverse dimensions of the holes 58 and 60. Here, the term "transverse dimensions" designates the dimensions situated in a horizontal plane. Here, the greatest transversal dimensions of the core 120 correspond to the zone where the vertical arms 130, 140 and 132, 142 overlap. These differences in dimensions between the holes and the magnetic core 120 create a clearance between the magnetic walls of the holes and the facing faces of the magnetic core. This clearance limits the mechanical constraints exerted by the printed circuit 4 on the magnetic core. This helps improve the precision of the sensor 2.

The magnetic core inserted in the holes 54, 56 is laid out as described for the core 120.

Figures 6, 8:
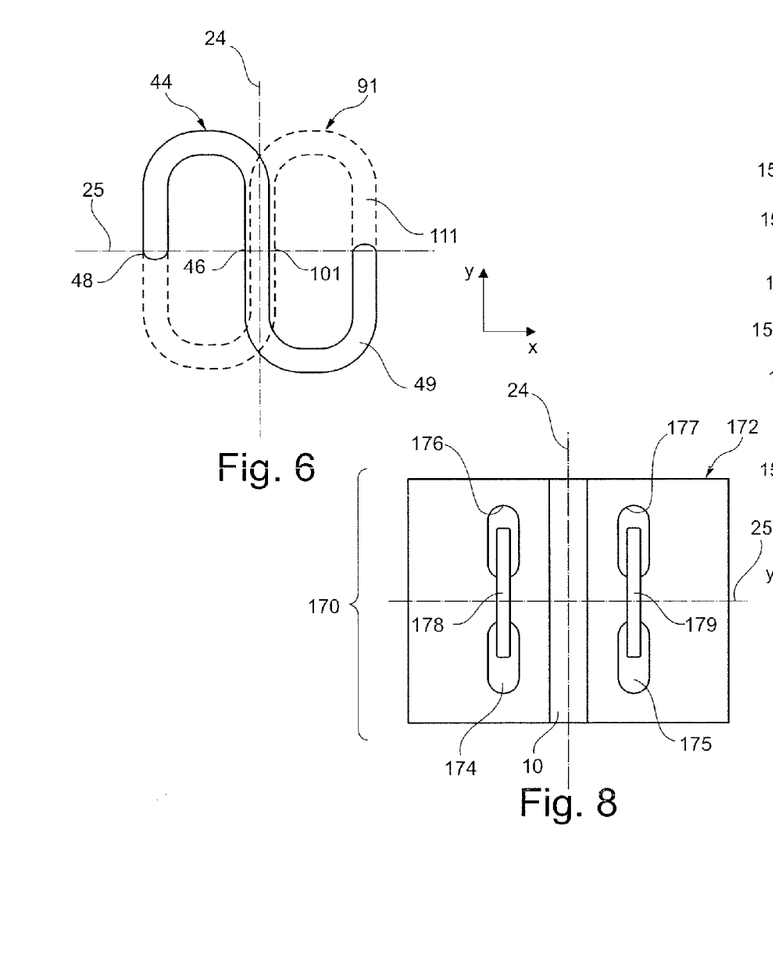
FIG. 6 is a schematic illustration in a top view of a current line of the printed circuit of FIG. 5.
FIG. 8 is a schematic and simplified illustration in a top view of another embodiment of the sensor of FIG. 1.

FIG. 6 illustrates a top view of the track 44 and, in dashes, a track 91 of the line 10 made in the metallization layer situated just beneath. For reasons of clarity, the segments 46 and 101 have been offset relatively to each other in the direction X so that the superimposition in the vertical direction of these segments is visible. As illustrated in this figure, the stacking of the conductive tracks of the line 10 of two immediately consecutive metallization layers in the direction Z forms a "8" when seen from above.

Figure 7:
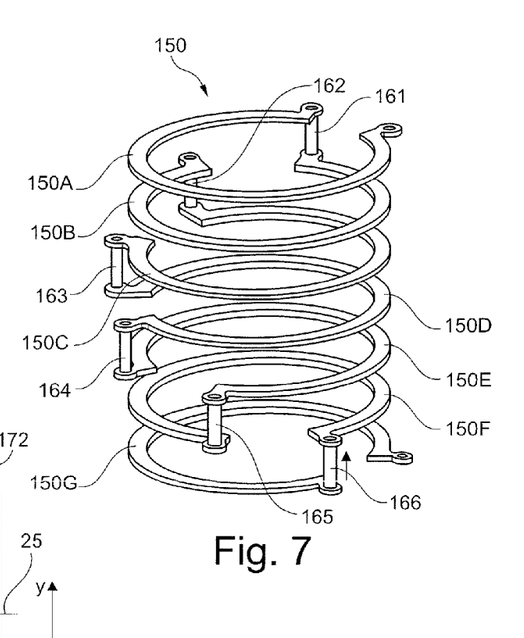
FIG. 7 is a schematic illustration in perspective of another embodiment of a vertical coil.

FIG. 7 shows another embodiment of a vertical coil 150. In this embodiment, a single turn 150A to 150G is formed in each metallization layer. The turns 150A to 150G are electrically connected to one another by vias 161 to 166. More specifically, the vias 161 to 166 respectively connect:
- the turns 150A and 150B,
- the turns 150B and 150C,
- the turns 150C and 150D,
- the turns 150D and 150E,
- the turns 150E and 150F, and
- the turns 150F and 150G.

In this embodiment, the vias 161 to 166 are uniformly distributed when seen from above, along the length of the external periphery of the coil 150. In these conditions, these vias can be through holes, blind holes or buried holes.

The different coils of the printed circuit 4 can be made as described for the coil 150.

FIG. 8 shows a current sensor 170. This current sensor 170 includes the printed circuit 172 and a processing unit which is similar to the processing unit 6 and is not shown. The printed circuit 172 is for example identical to the printed circuit 4 except that it is modified to show two "fluxgate" sensors. These two "fluxgate" sensors are each positioned on a respective side of the plane 24. To this end, the holes 54, 56, 58 and 60 are replaced respectively by oblong holes 174 to 177, the greatest width of which is parallel to the plane 24.

In this embodiment, the sensor 170 has two magnetic cores 178 and 179. These cores each form a ring. However, in this embodiment, the core 178 passes through the holes 178 and 176 while the core 176 passes through the holes 175 and 177. These cores 178 and 179 are for example made as described with reference to FIG. 5. These cores 178 and 179 therefore do not surround the current line 10.

The distance between the holes 174 to 177 of the line 10 is adjusted so as to adjust the voltage generated by the measurement coils. Thus, this sensor 170 can easily be adapted to the measurement of high-intensity current, i.e. currents whose intensity exceeds 1 A and preferably 100 A or 1000 A.

Figure 9:
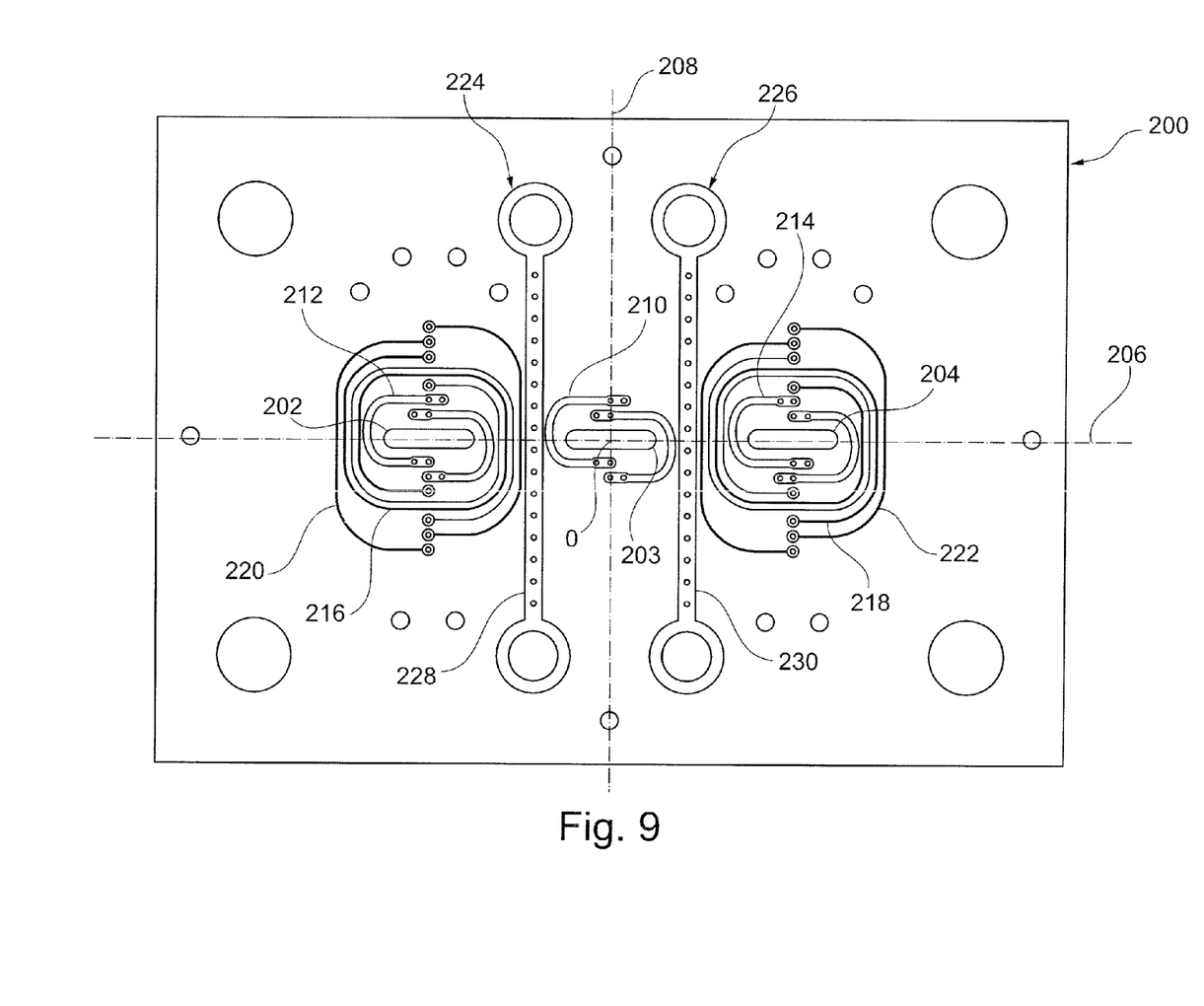
FIG. 9 is an illustration in a top view of a metallization layer of a printed circuit for another embodiment of the current sensor.

FIG. 9 represents a metallization layer of a printed circuit 200. The printed circuit 200 has three oblong holes 202 to 204. The greatest width of these holes 202 to 204 is included in a vertical plane 206. The plane 206 also forms a plane of symmetry of the holes 202 to 204. The holes 202 to 204 are also symmetrical relatively to a vertical plane 208 perpendicular to the plane 206. The hole 203 extends along the axis O defined by the intersection of the planes 206 and 208.

A vertical excitation coil 210 is wound around the hole 203 and two other vertical excitation coils 212 and 214 are wound respectively around the holes 202 and 204.

Vertical measurement coils 216 and 218 are wound around the holes 202 and 204 respectively. In this figure, vertical compensation coils 220 and 222 are represented as being wound respectively around the coils 216 and 218.

The printed circuit 200 also has two conductive lines 224 and 226 in which there flow two currents to be measured. As above, these conductive lines are formed by conductive tracks made in the different metallization layers. In FIG. 9, only the conductive tracks 228 and 230 and the lines 224 and 226 respectively are visible. These tracks 228 and 230 are rectilinear and extend perpendicularly to the plane 206. The track 228 is laid out between the holes 202 and 203 while the track 230 is laid out between the holes 203 and 204.

The three arms of the magnetic core inserted in the holes 202 to 204 are connected magnetically to one another above and beneath the printed circuit 200 by substantially horizontal magnetic horizontal members.

Typically, the printed circuit 200 is designed for making a differential current sensor. To this end, the lines 224 and 226 are connected to currents to be measured flowing in opposite senses in these lines. Thus, the coil 216 performs the following measurement: $M_a = B_1 - B_2 + B_{ex}$. The measurement taken by the coil 218 is given by the relationship $M_b = -B_1 + B_2 + B_{ex}$. The magnetic fields $B_1$ and $B_2$ are the magnetic fields generated by the currents flowing respectively in the lines 224 and 226. The magnetic field $B_{ex}$ is the magnetic field generated by the excitation coils 210, 212 and 214.

The difference between the measurements $M_1$ and $M_2$ therefore gives a compensated measurement of the difference between the magnetic fields $B_1$ and $B_2$. From this difference, an electronic processor deduces the difference between the intensities of the currents flowing in the lines 224 and 226. A differential current sensor of this kind is useful for making a differential circuit breaker.

Many other embodiments are possible. For example, compensation coils may be used. These enable working in a zero field. The compensation coil is made as described for the other coils of the sensor.

In another embodiment, one and the same sensor fulfills several functions. For example, one and the same coil fulfills the measurement coil and excitation coil function. In this case, the excitation coil can be omitted. One and the same coil can fulfill the functions of measurement coil and compensation coil.

The coils of a same pair are not necessarily laid out symmetrically relatively to the plane 24. In this case, if the measurement coils are not symmetrical relatively to this plane 24, the magnetic core must surround the conductive line. In another embodiment, if this symmetry is not complied with, it is also possible to surround the printed circuit with an electromagnetic shielding which attenuates the external homogenous magnetic field such as the earth's magnetic field.

The layout of the measurement, excitation and compensation coils wound around a same axis can be modified. For example, the excitation coil is wound around the measurement coil.

The turns of the different wound coils wound around a same axis can be interlaced as described with reference to FIG. 6 in the U.S. Pat. No. 7,372,261.

As a variant, each coil has only one turn per metallization layer.

The measurement coils of a same pair are not necessarily identical. In this case, these differences can be compensated for by the processing unit.

In a simplified embodiment, the coils 26, 28, 40 and 42 are omitted. In this case, the directions of measurement of the coils 16 and 18 are in opposite senses. The excitation coils 36, 38 are laid out so that the magnetic excitation field is in the same sense in both coils 16, 18. Thus, the sum of the measurements of the coils 16 and 18 reduces or cancels the contribution of the magnetic excitation field in the voltage generated.

A same conductive track of the current line 10 can cross the planes 50 and 52 several times in the same sense. For example, to this end, this track surrounds the measurement coil several times. Conversely, it is also possible that the line 10 will pass only once between the measurement coils.

As a variant, the loop portions 48, 111 to 116 can circumvent the same measurement coil from the exterior. Nor is it necessary to alternate the windings of the measurement coils situated to the right and to the left of the plane 24 as described here. For example, the loop portions 110 to 112 are to the left of the measurement coil 26 and the loop portions 113 to 115 are to the right of the measurement coil 28 in FIG. 5.

In another variant, the segments 46, 101 to 105 are not series-connected but parallel-connected.

Half of the segments 46, 101 to 105 are used to make a current flow in one sense and the other half to make a current flow in the opposite sense. The difference between the intensities of these two currents is then measured.

The loop portions 48 to 49 can be at least two or three times more distant from the measurement coils than the segments of the conductive tracks of the line 10.

The line 10 can also be replaced for example by two current lines in which two currents flow. In these conditions, the current sensor measures the resultant of the combination of the magnetic fields $B_{i1}$ and $B_{i2}$ generated respectively by the currents $i_1$ and $i_2$ flowing in each of the current lines. If these current lines $i_1$ and $i_2$ flow in opposite directions, then the current sensor is a differential current sensor.

The line 10 can also be replaced by a conductor that is mechanically independent of the printed circuit. In this case, advantageously the printed circuit has a groove or a throughhole passing between the measurement coils 16 and 18 and between the measurement coils 26 and 28 capable of receiving this conductor. The conductor is then for example a conductive bar positioned in parallel to the plane of the printed circuit.

Other embodiments of the magnetic ring 120 are possible. For example, it can be made by winding a wire or a magnetic tape in the holes 30, 32. In this case, preferably, the tape or the wire forms one or more turns each passing through the holes 30, 32.

The magnetic core inserted into the holes of the printed circuit is not necessarily a ring. As a variant, each ring is replaced by two bars magnetically isolated from each other. These bars are inserted into the same holes as the ring.

In another embodiment, the magnetic core is omitted. A Rogowski structure is then obtained.

It is also possible to superimpose several multilayer printed circuits in order to increase the length/width ratio of the magnetic rings as well as the number of turns of the sensor.

It is also possible, along one and the same electrical conductor in which the current has to be measured, to place several of the current sensors described here above.

The invention claimed is:

1. An apparatus for sensing current comprising a printed circuit and one or more current lines, wherein said printed circuit comprises a stack, along a vertical direction, of several metallization layers mechanically separated from one another by electrically insulating layers, and at least one of a measurement coil and an excitation coil wound around a vertical winding axis in the vertical direction, said at least one of a measurement coil and an excitation coil being formed by conductive tracks made in at least one of said several metallization layers, and wherein said one or more current lines are positioned in parallel to a plane defined by said metallization layers, said one or more current lines being configured to be supplied with one or more currents to be measured, wherein said at least one of a measurement coil and an excitation coil comprises turns formed by conductive tracks, made in respective metallization layers, electrically connected to one another by pads passing through at least one of said electrically insulating layers, to form a coil that extends along said vertical winding axis;

wherein said at least one of a measurement coil and an excitation coil comprises a first measurement coil and a second measurement coil, and wherein each current line comprises at least one first conductive track and one second conductive track passing between said first measurement coil and said second measurement coils, said first conductive track and said second conductive track being made in respective metallization layers positioned one above the other, and an electrical connection setting up a series connection between said first conductive track and said second conductive track without passing between said first measurement coil and said second measurement coil, said electrical connection forming, with said first conductive track and said second conductive track, a loop completely surrounding at least one of said measurement coils so that, when said loop is powered, current passes several times in the same sense between said first measurement coil and said second measurement coil.

2. The apparatus of claim 1, wherein said printed circuit comprises vertical walls defining a hole made along each vertical winding axis, and wherein said current sensor comprises a magnetic core housed within said hole, said magnetic core having transverse dimensions parallel to a plane defined by said metallization layers that are smaller, by at least 5 micrometers, than corresponding transverse dimensions of said hole, thereby creating a clearance between said vertical walls defining said hole and vertical faces facing said magnetic core.

3. The apparatus of claim 1, wherein said at least one of a measurement coil and an excitation coil comprises a first pair of measuring coils formed by first and second measurement coils positioned on either side of a current line and laid out so that one of a sum and difference of magnetic fields measured by each of said coils preserves a contribution of a magnetic field generated by said one or more current lines and reduces a contribution of any homogenous magnetic field throughout a surface of said printed circuit.

4. The apparatus of claim 3, further comprising walls defining a through-hole through a center of each coil, and wherein said current sensor comprises a magnetic ring passing through holes at centers of said first measurement coil and said second measurement coil of said first pair of measuring coils.

5. A printed circuit board for sensing current comprising a printed circuit and one or more current lines, wherein said printed circuit comprises a stack, along a vertical direction, of several metallization layers mechanically separated from one another by electrically insulating layers, and at least one of a measurement coil and an excitation coil wound around a vertical winding axis in the vertical direction, said at least one of a measurement coil and an excitation coil being formed by conductive tracks made in at least one of said several metallization layers, and wherein said one or more current lines are positioned in parallel to a plane defined by said metallization layers, said one or more current lines being configured to be supplied with one or more currents to be measured, wherein said at least one of a measurement coil and an excitation coil comprises turns formed by conductive tracks, made in respective metallization layers, electrically connected to one another by pads passing through at least one of said electrically insulating layers, to form a coil that extends along said vertical winding axis;

wherein said at least one of a measurement coil and an excitation coil comprises a first measurement coil and a second measurement coil, and wherein each current line comprises at least one first conductive track and one second conductive track passing between said first measurement coil and said second measurement coils, said first conductive track and said second conductive track being made in respective metallization layers positioned one above the other, and an electrical connection setting up a series connection between said first conductive track and said second conductive track without passing between said first measurement coil and said second measurement coil, said electrical connection forming, with said first conductive track and said second conductive track, a loop completely surrounding at least one of said measurement coils so that, when said loop is powered, current passes several times in the same sense between said first measurement coil and said second measurement coil.

6. The apparatus of claim 5, wherein said at least one of a measurement coil and an excitation coil comprises a first pair of coils formed by a first and a second coil formed on either side of said current line, said first coil and said second coil being symmetric relative to a first vertical plane, and a second pair of coils symmetrical with said first pair of coils relative to a second vertical plane perpendicular to said first vertical plane.

7. The apparatus of claim 5, wherein said at least one of a measurement coil and an excitation coil comprises a measurement coil and an excitation coil that are concentric, wherein turns of each of said coils are made in a common metallization layer and are wound around     a common winding axis.

8. An apparatus for sensing current comprising a printed circuit and one or more current lines, wherein said printed circuit comprises a stack, along a vertical direction, of several metallization layers mechanically separated from one another by electrically insulating layers, and at least one of a measurement coil and an excitation coil wound around a vertical winding axis in the vertical direction, said at least one of a measurement coil and an excitation coil being formed by conductive tracks made in at least one of said several metallization layers, and wherein said one or more current lines are positioned in parallel to a plane defined by said metallization layers, said one or more current lines being configured to be supplied with one or more currents to be measured, wherein said at least one of a measurement coil and an excitation coil comprises turns formed by conductive tracks, made in respective metallization layers, electrically connected to one another by pads passing through at least one of said electrically insulating layers, to form a coil that extends along said vertical winding axis;

wherein said at least one of a measurement coil and an excitation coil comprises a first pair of coils and a second pair of coils positioned one after another along said current line or lines, each of said first pair of coils and said second pair of coils comprising a first measurement coil and a second measurement coil positioned on either side of said current line or lines, a through hole being made through a center of each coil, and wherein there is a current sensor comprising a first magnetic ring and a second magnetic ring, said first magnetic ring passing through said through holes in the center of said measurement coils of said first pair and said second magnetic ring passing through said through holes in the center of measurement coils of said second pair.

9. An apparatus for sensing current comprising a printed circuit and one or more current lines, wherein said printed circuit comprises a stack, along a vertical direction, of several metallization layers mechanically separated from one another by electrically insulating layers, and at least one of a measurement coil and an excitation coil wound around a vertical winding axis in the vertical direction, said at least one of a measurement coil and an excitation coil being formed by conductive tracks made in at least one of said several metallization layers, and wherein said one or more current lines are positioned in parallel to a plane defined by said metallization layers, said one or more current lines being configured to be supplied with one or more currents to be measured, wherein said at least one of a measurement coil and an excitation coil comprises turns formed by conductive tracks, made in respective metallization layers, electrically connected to one another by pads passing through at least one of said electrically insulating layers, to form a coil that extends along said vertical winding axis;

wherein said at least one of a measurement coil and an excitation coil comprises a first pair of coils and a second pair of coils positioned one after the other along said current line or lines, each pair of coils comprising first measurement coil and a second measurement coil positioned on either side of said current line or lines, a through-hole being made through a center of each coil, and wherein said current sensor comprises a first magnetic ring and a second magnetic ring, said first magnetic ring passing through holes through a center of said first coils of each pair, and said second magnetic ring passing through holes through a center of said second coils of each pair so that each magnetic ring is situated on a respective side of a vertical plane passing through said current line or lines.

* * * * *